United States Patent
Lee et al.

(10) Patent No.: US 9,864,018 B2
(45) Date of Patent: Jan. 9, 2018

(54) METHOD OF DIAGNOSING FAULT BY USING IMPEDANCE OF OUTPUT TERMINAL OF POWER SUPPLY DEVICE FOR ENVIRONMENTALLY-FRIENDLY VEHICLE

(71) Applicant: HYUNDAI MOTOR COMPANY, Seoul (KR)

(72) Inventors: Dong Jun Lee, Suwon-si (KR); Won Kyoung Choi, Hwaseong-si (KR)

(73) Assignee: HYUNDAI MOTOR COMPANY, Seoul (KR)

( * ) Notice: Subject to any disclaimer, the term of this patent is extended or adjusted under 35 U.S.C. 154(b) by 345 days.

(21) Appl. No.: 14/558,709

(22) Filed: Dec. 2, 2014

(65) Prior Publication Data
US 2015/0233993 A1 Aug. 20, 2015

(30) Foreign Application Priority Data
Feb. 19, 2014 (KR) .................. 10-2014-0018803

(51) Int. Cl.
*G01R 27/00* (2006.01)
*G01R 31/40* (2014.01)
*G01R 31/00* (2006.01)

(52) U.S. Cl.
CPC ............ *G01R 31/40* (2013.01); *G01R 31/007* (2013.01)

(58) Field of Classification Search
CPC ........ G01R 27/00; G01R 31/00; G01R 31/02; G01R 31/007; G01R 31/40; G01R 27/205; G01R 31/2812; G01R 19/16571; H02M 2001/325; H02P 29/024; H02P 29/0241; H02P 29/0243; H02P 29/025; H02P 29/027
See application file for complete search history.

(56) References Cited

U.S. PATENT DOCUMENTS

| | | | |
|---|---|---|---|
| 6,718,513 B1* | 4/2004 | Ryu ........................ | H04L 41/06 370/242 |
| 2012/0229939 A1* | 9/2012 | Mikani ................ | H02H 1/0015 361/55 |
| 2013/0054167 A1* | 2/2013 | Park ........................ | H02M 3/28 702/65 |

FOREIGN PATENT DOCUMENTS

| | | |
|---|---|---|
| JP | 08-331753 A | 12/1996 |
| JP | 2001-028844 A | 1/2001 |
| JP | 2001-045602 A | 2/2001 |
| JP | 2004-301724 A | 10/2004 |
| JP | 2008-082275 A | 4/2008 |
| JP | 2009-213246 A | 9/2009 |
| JP | 2012-039778 A | 2/2012 |
| KR | 10-2009-0062339 A | 6/2009 |
| KR | 10-2012-0056125 A | 6/2012 |
| KR | 10-2013-0011073 A | 1/2013 |

(Continued)

*Primary Examiner* — Son Le
(74) *Attorney, Agent, or Firm* — McDermott Will & Emery LLP

(57) ABSTRACT

A method of diagnosing a fault by using impedance of an output terminal of a power supply device for an environmentally-friendly vehicle is provided. The method estimates impedance of the output terminal of the power supply device and diagnoses a fault by using the estimated impedance, thereby preventing an auxiliary battery from being discharged. Whether or not the fault is generated according to the impedance when the estimated impedance exceeds a reference value is determined.

6 Claims, 3 Drawing Sheets

(56) References Cited

FOREIGN PATENT DOCUMENTS

KR           101220390 B1 *  1/2013  ............. H02M 3/28
KR   10-2013-0031583 A     3/2013

* cited by examiner

- Prior Art -

METHOD OF DIAGNOSING FAULT BY USING IMPEDANCE OF OUTPUT TERMINAL OF POWER SUPPLY DEVICE FOR ENVIRONMENTALLY-FRIENDLY VEHICLE

CROSS-REFERENCE TO RELATED APPLICATION

This application claims under 35 U.S.C. §119(a) the benefit of priority to Korean Patent Application No. 10-2014-0018803 filed on Feb. 19, 2014, the entire contents of which are incorporated herein by reference.

TECHNICAL FIELD

The present disclosure relates to a method of diagnosing a fault by using impedance of an output terminal of a power supply device for an environmentally-friendly vehicle. More particularly, it relates to a method of diagnosing a fault by using impedance of an output terminal of a power supply device for an environmentally-friendly vehicle, which estimates impedance of the output terminal of the power supply device and diagnoses a fault by using the estimated impedance, thereby preventing an auxiliary battery from being discharged.

BACKGROUND

As illustrated in FIG. 1, a power supply device for an environmentally-friendly vehicle, such as a hybrid vehicle, an electric vehicle, and a fuel cell vehicle, includes a high voltage battery 10, and an inverter 12 for converting a direct-current voltage of the high voltage battery 10 into an alternating current voltage to supply the converted voltage to a motor 11 for driving. A 12 V auxiliary battery 14 supplies a direct current voltage to an electric component of the vehicle when the vehicle starts to drive and supplies a voltage necessary for operating a main relay of the high voltage battery. A DC-DC converter 13 converts the direct current voltage received from the high voltage battery to charge the auxiliary battery 14 or to supply the converted voltage to a 12 V electric load 15, and the like.

The DC-DC converter 13 converts a voltage of the high voltage battery into a low voltage (+12 V) to charge the auxiliary battery, such as an alternator of an internal combustion engine, and to supply the converted voltage to various types of electric components (electric loads).

In this case, a connection line between the high voltage battery 10 and the DC-DC converter 13, and a line connected from the DC-DC converter 13 to the auxiliary battery 14 and the electric load 15 is formed of a cable.

The power supply device for the environmentally-friendly vehicle has the following problem.

Impedance of the output terminal of the DC-DC converter may be increased by an abnormal state (damage by external force, and the like) of the cable connecting the respective elements of the power supply device or corrosion of the cable due to aging of the respective elements of the power supply device.

When the impedance of the output terminal of the DC-DC converter is increased, a voltage is dropped in an input terminal of the auxiliary battery or an electronic load receiving the voltage from the DC-DC converter, and the voltage drop decreases a charging current for the auxiliary battery, and directly causes the discharge of the auxiliary battery.

In the state where the charging current of the auxiliary battery is decreased so that the voltage is dropped to a normal level or lower, the auxiliary battery fails to supply a voltage appropriate to an operation voltage of each controller, so that starting of the hybrid vehicle may be impossible.

A fault diagnosis for the impedance increase is not performed, so that an erroneous repair (replacement of only the auxiliary battery) may be caused, and as a result, the auxiliary battery is discharged again.

The above information disclosed in this Background section is only for enhancement of understanding of the background of the invention, and therefore, it may contain information that does not form the prior art that is already known in this country to a person of ordinary skill in the art.

SUMMARY OF THE DISCLOSURE

The present invention has been made in an effort to solve the above-described problems associated with the prior art.

An aspect of the present disclosure provides a method of diagnosing a fault by using impedance of an output terminal of a power supply device for an environmentally-friendly vehicle. The method is capable of preventing an erroneous replacement of an auxiliary battery, and accurately performing a repair, such as a replacement of a cable causing an impedance increase, by an impedance fault diagnosis logic of estimating impedance of an output terminal of a DC-DC converter, and determining that the fault is generated with respect to the impedance when the estimated impedance exceeds a reference value.

According to an exemplary embodiment of the present disclosure, a method of diagnosing a fault by using impedance of an output terminal of a power supply device for an environmentally-friendly vehicle includes estimating impedance of the output terminal of a DC/DC converter. When the estimated impedance exceeds a reference value, whether or not a fault is generated by an increase in the impedance of the output terminal of the DC/DC converter is determined.

The step of estimating the impedance of the output terminal of the DC/DC converter may include measuring a voltage difference between an output voltage of the DC/DC converter and an input voltage of an intelligent battery sensor (IBS) of an auxiliary battery terminal. The measured voltage difference is compared to a charge/discharge current of an auxiliary battery to calculate the impedance.

The step of estimating of the impedance of the output terminal of the DC/DC converter may include measuring a voltage difference between an output voltage of the DC/DC converter and an input voltage of an electric load. The measured voltage difference is compared to a charge/discharge current of an auxiliary battery to calculate the impedance.

The step of determining that the fault is generated by the increase in the impedance of the output terminal of the DC/DC converter may include when the estimated impedance exceeds the reference value, increasing a fault count value. When the fault count value is larger than a predetermined fault count value, whether the fault is generated by the increase in the impedance is determined.

The method may further include when the estimated impedance does not exceed the reference value, resetting a fault count value.

Through the aforementioned technical solutions, the present disclosure provides the effects below.

First, impedance of the output terminal of the DC/DC converter is estimated and a fault is diagnosed by using estimated impedance, so that it is possible to accurately diagnose a cause (damage of a cable and the like, erroneous assembling of the cable and a bolt for grounding) of an increase in impedance.

Second, when it is determined that the fault with respect to the impedance is generated as a result of the estimation of the impedance, a warning may be provided to a driver to induce a vehicle to visit a maintenance shop before full-discharge of the auxiliary battery, and the driver may receive an accurate repair, such as a replacement of a cable causing the increase in impedance.

Third, it is possible to accurately perform a repair action solving the cause of the increase in impedance, thereby preventing an existing erroneous repair, such as a replacement of an auxiliary battery in a normal state.

Other aspects and exemplary embodiments of the invention are discussed infra.

It is understood that the term "vehicle" or "vehicular" or other similar term as used herein is inclusive of motor vehicles in general, such as: passenger automobiles including sports utility vehicles (SUV), buses, trucks, and various commercial vehicles; watercraft including a variety of boats and ships, aircraft, and the like; and includes hybrid vehicles, electric vehicles, plug-in hybrid electric vehicles, hydrogen-powered vehicles, and other alternative fuel vehicles (e.g. fuels derived from resources other than petroleum). As referred to herein, a hybrid vehicle is a vehicle that has two or more sources of power, for example both gasoline-powered and electric-powered vehicles.

The above and other features of the invention are discussed infra.

BRIEF DESCRIPTION OF THE DRAWINGS

The above and other features of the present invention will now be described in detail with reference to certain exemplary embodiments thereof illustrated by the accompanying drawings which are given hereinbelow by way of illustration only, and thus are not limitative of the present invention.

Figure 1:
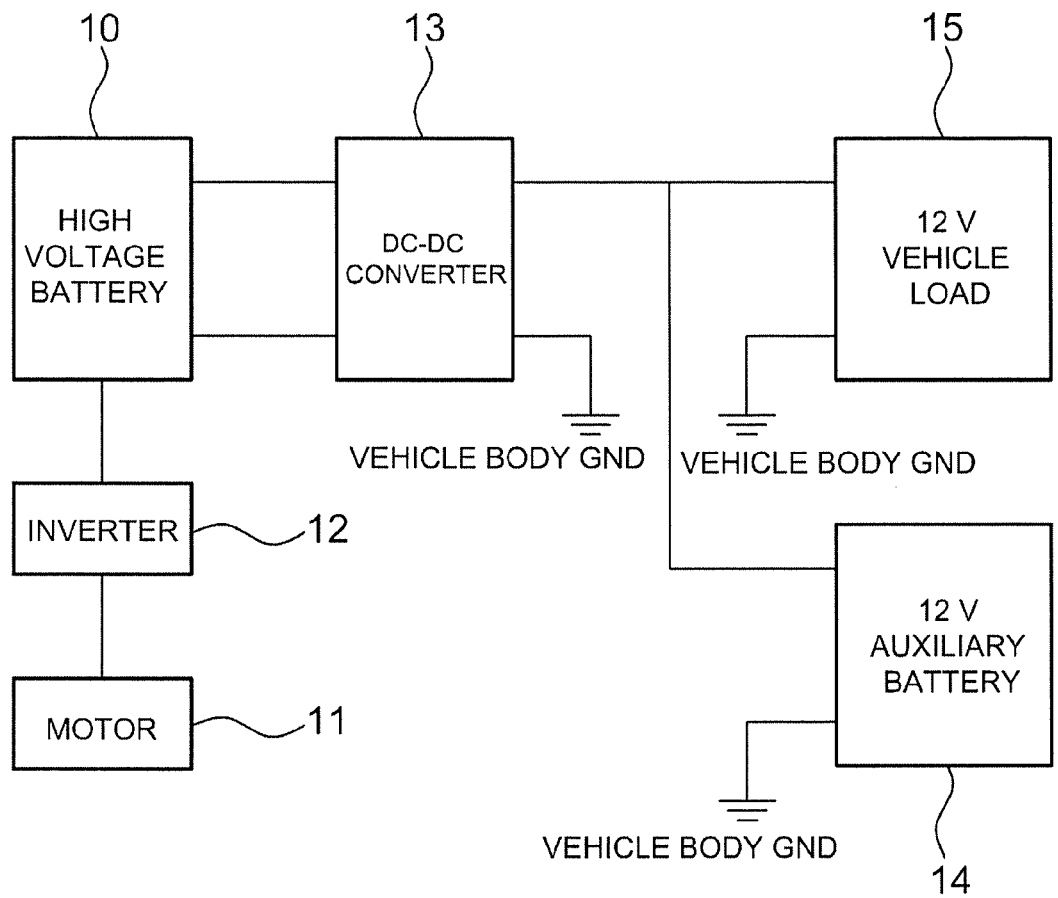
FIG. 1 is a configuration diagram of a power supply device for an environmentally-friendly vehicle.

It should be understood that the appended drawings are not necessarily to scale, presenting a somewhat simplified representation of various features illustrative of the basic principles of the invention. The specific design features of the present invention as disclosed herein, including, for example, specific dimensions, orientations, locations, and shapes will be determined in part by the particular intended application and use environment.

In the figures, reference numbers refer to the same or equivalent parts of the present invention throughout the several figures of the drawing.

DETAILED DESCRIPTION

Hereinafter reference will now be made in detail to various embodiments of the present disclosure, examples of which are illustrated in the accompanying drawings and described below. While the invention will be described in conjunction with exemplary embodiments, it will be understood that the present description is not intended to limit the invention to those exemplary embodiments. On the contrary, the invention is intended to cover not only the exemplary embodiments, but also various alternatives, modifications, equivalents and other embodiments, which may be included within the spirit and scope of the invention as defined by the appended claims.

When a (+) terminal of a DC-DC converter mounted in an environmentally-friendly vehicle is connected to a terminal stand of a 12 V electric load and an auxiliary battery, and a (−) terminal is groundably connected to the DC-DC converter itself or a vehicle frame, and a general bolt, not a regulated bolt is adopted as a bolt for grounding, impedance is generated, so that an error may be generated in a power supply system.

As described above, impedance of an output terminal of the DC-DC converter is increased due to an abnormal state (damage by external force, and the like) of a cable connecting the respective elements of the power supply device or corrosion of the cable according to aging, erroneous assembling of the cable and a bolt for grounding, and the like, and discharge of the auxiliary battery is facilitated due to the impedance increase.

In this respect, the present disclosure places emphasis on estimating impedance of an output terminal of a DC-DC converter, determining that a fault is generated according to an increase in the impedance of the output terminal of the DC-DC converter when the estimated impedance is increased to exceed a reference value, accurately diagnosing the type of cause of the increase in the impedance as damage of a cable and the like, erroneous assembling of the cable and a bolt for grounding, and the like, and performing post management.

Figure 4:
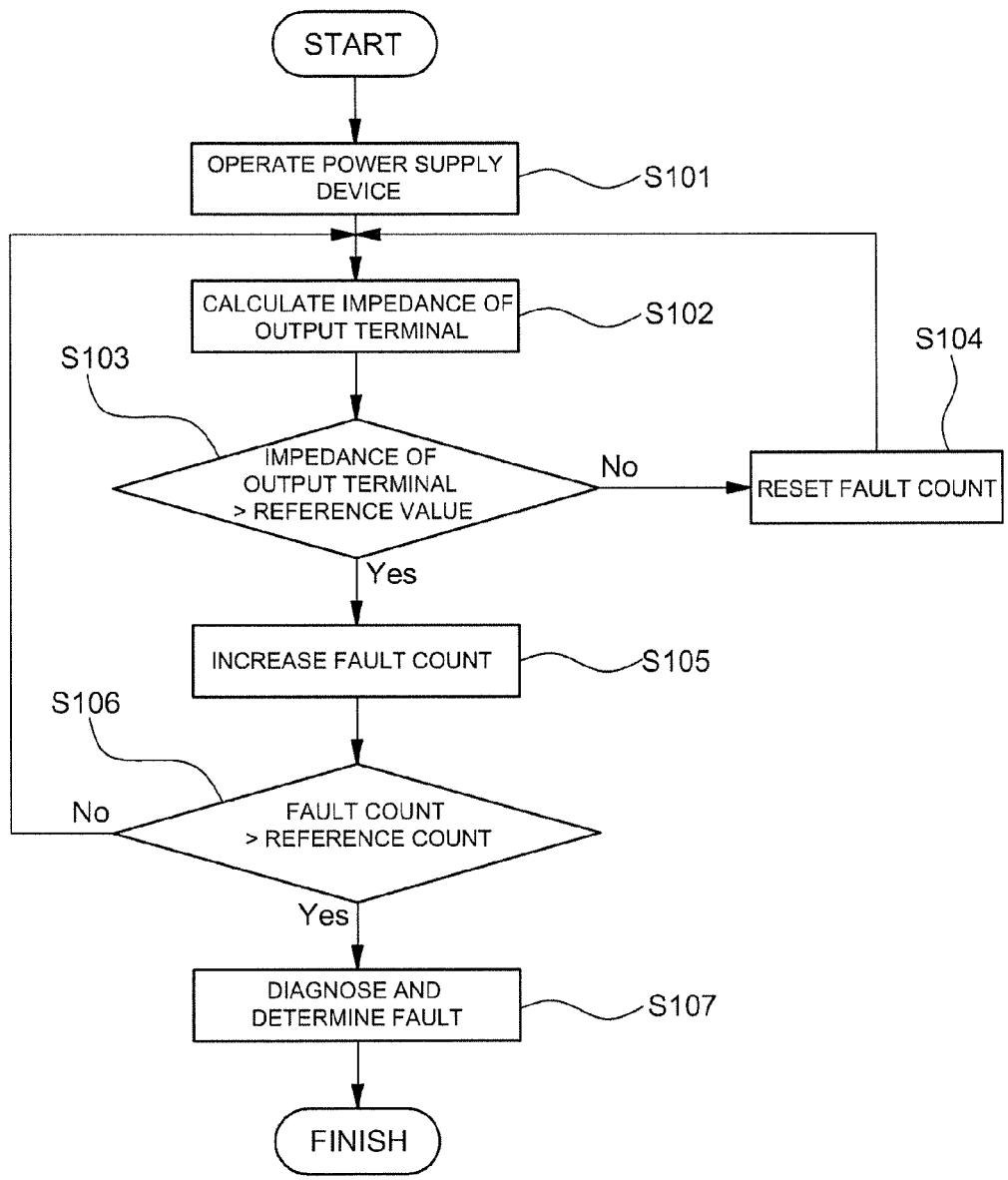
FIG. 4 is a flowchart illustrating a method of estimating impedance of an output terminal of a power supply device for an environmentally-friendly vehicle according to the present disclosure.

FIG. 4 is a flowchart illustrating a method of estimating impedance of an output terminal of a power supply device for an environmentally-friendly vehicle according to the present disclosure.

First, after starting of a hybrid vehicle begins, a DC-DC converter of the power supply device becomes an operable state (S101), and thus, the DC-DC converter charges an auxiliary battery with a voltage from a high voltage battery or supplies the voltage to various electric loads.

Next, impedance of the output terminal of the DC-DC converter is estimated during the operation of the DC-DC converter (S102).

Figure 2:
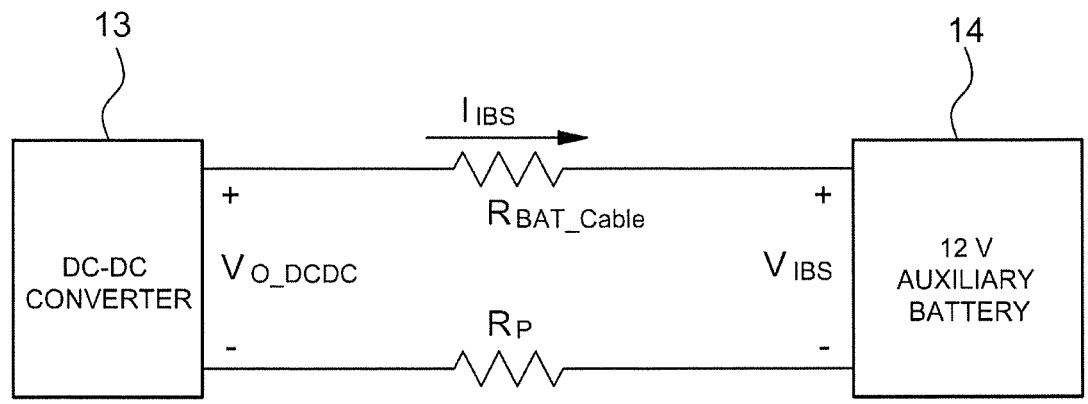
FIG. 2 is a diagram schematically illustrating a method of estimating impedance of an output terminal of a power supply device for an environmentally-friendly vehicle according to an exemplary embodiment of the present disclosure.

As can be seen in FIG. 2, the method of estimating impedance according to an exemplary embodiment of the present disclosure is applied to the case where the DC-DC converter 13 and the auxiliary battery 14 are connected through a cable, and an intelligent battery sensor (IBS) for diagnosing a general state of the battery, such as measuring a current, a voltage, and a temperature of the auxiliary battery, is adopted.

First, an output voltage $V_{O\_DCDC}$ of the DC-DC converter and an input voltage $V_{IBS}$ of the IBS are measured and compared with each other, so that a difference between the voltages is calculated.

Next, as can be seen in Equation 1, the difference between the output voltage $V_{O\_DCDC}$ of the DC-DC converter and the input voltage $V_{IBS}$ of the IBS is compared with a charge/discharge current $I_{IBS}$ of the auxiliary battery to calculate impedance $R_P$.

$$(V_{o\_DCDC}-V_{IBS})/I_{IBS}=R_P \qquad \text{Equation 1:}$$

Subsequently, the impedance $R_P$ estimated by Equation 1 is compared to a reference value $R_{LIMIT}$ (S103), and when it is determined that the estimated impedance exceeds the reference value, it is determined the fault is generated according to the increase in the impedance of the output terminal of the DC-DC converter, that is, the fault is generated according to deterioration or corrosion of the cable and the like, damage of the cable, erroneous assembling of the cable and the bolt for grounding, and the like.

However, when the estimated impedance does not exceed the reference value, a fault count value is reset (S104).

Since the increase in the impedance may be a temporary phenomenon, a fault count value, which indicates the number of times of the case where the estimated impedance exceeds the reference value, is counted (S105), the counted fault count value is compared with a predetermined fault count value (the predetermined number of fault times) (S106), and when the counted fault count value is larger than the predetermined fault count value, it is finally determined that the fault is generated according to the increase in the impedance (S107).

When it is determined that the fault is generated according to the increase in the impedance of the DC-DC converter, a voice warning (for example, a warning sound) and a visual warning (for example, a cluster pop-up) are provided to a driver.

As described above, according to the exemplary embodiment of the present disclosure, impedance of the output terminal of the DC-DC converter is estimated by using the output voltage $V_{O\_DCDC}$ of the DC-DC converter and the input voltage $V_{IBS}$ of the IBS, so that when it is determined that the fault is generated according to the increase in the impedance of the output terminal of the DC-DC converter, it is possible to induce a repair for solving the cause (damage of the cable, erroneous assembling of the cable and the bolt for grounding, and the like) of the increase in the impedance.

Figure 3:
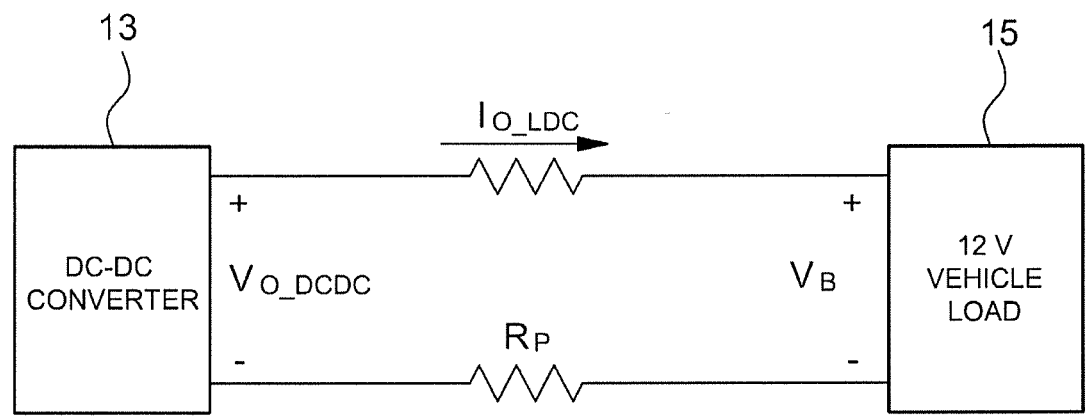
FIG. 3 is a diagram schematically illustrating a method of estimating impedance of an output terminal of a power supply device for an environmentally-friendly vehicle according to another exemplary embodiment of the present disclosure.

As can be see in FIG. 3, a method of estimating impedance according to another exemplary embodiment of the present invention is applied to the case where the IBS does not exist, and the DC-DC converter 13 and the 12 V electric load 15 are connected with a cable.

First, in order to estimate impedance of the output terminal of the DC-DC converter according to another exemplary embodiment of the present disclosure, first, a voltage difference between an output voltage of the DC-DC converter and an input voltage of an electric load (for example, a controller operated by the 12 V auxiliary battery) is measured.

Next, the measured voltage difference is compared with a charge/discharge current of the auxiliary battery to calculate impedance.

That is, the impedance is calculated by dividing the voltage difference between the output voltage of the DC-DC converter and the input voltage of an electric load by the charge/discharge current of the auxiliary battery.

Subsequently, when it is determined that the estimated impedance exceeds a reference value similar to the aforementioned exemplary embodiment, it is determined the fault is generated according to the increase in the impedance of the output terminal of the DC-DC converter, that is, the fault is generated according to deterioration or corrosion of the cable and the like, damage of the cable, erroneous assembling of the cable and the bolt for grounding, and the like.

As described above, through an impedance fault diagnosis logic of estimating impedance of the output terminal of the DC-DC converter, and determining that the fault is generated according to the impedance when the estimated impedance exceeds a reference value, it is possible to induce a vehicle to visit a maintenance shop before the discharge of the auxiliary battery in order to solve problems according to the increase in impedance, and receive an accurate repair, such as a replacement of a cable causing the increase in impedance.

The invention has been described in detail with reference to exemplary embodiments thereof. However, it will be appreciated by those skilled in the art that changes may be made in these embodiments without departing from the principles and spirit of the invention, the scope of which is defined in the appended claims and their equivalents.

What is claimed is:

1. A method of diagnosing a fault by using impedance of an output terminal of a power supply device for an environmentally-friendly vehicle, wherein the power supply device includes a high voltage battery, an inverter for converting a direct-current voltage of the high voltage battery into an alternating current voltage and supplying the converted voltage to a motor for driving, a 12 V auxiliary battery for supplying a direct-current voltage to an electric component of the vehicle when the vehicle starts to drive and supplying a voltage necessary for operating a main relay of the high voltage battery, and a DC-DC converter for converting the direct-current voltage received from the high voltage battery to charge the auxiliary battery or to supply the converted voltage to a 12 V electric load, the method comprising steps of:
estimating, by the power supply device, the impedance of the output terminal of the DC-DC converter; and
determining, by the power supply device, when the estimated impedance exceeds a reference value, that the fault is generated according to an increase in the impedance of the output terminal of the DC-DC converter,
wherein the step of estimating the impedance of the output terminal of the DC-DC converter includes steps of:
estimating, by the power supply device, a voltage difference between an output voltage of the DC-DC converter and an input voltage of an intelligent battery sensor (IBS) of an auxiliary battery; and
comparing, by the power supply device, the measured voltage difference and a charge/discharge current to calculate the impedance.

2. The method of claim 1, wherein the step of determining that the fault is generated by the increase in the impedance of the output terminal of the DC-DC converter includes steps of:
increasing, by the power supply device, a fault count value when the estimated impedance exceeds the reference value;
determining, by the power supply device, that the fault is generated by the increase in the impedance when the fault count value is larger than a reference fault count value.

3. The method of claim 1, further comprising:
resetting a fault count value when the estimated impedance does not exceed the reference value.

4. The method of claim 1, wherein the DC-DC converter and the auxiliary battery are connected through a cable.

5. The method of claim 1, wherein the IBS diagnoses a general state of the auxiliary battery.

6. A method of diagnosing a fault by using impedance of an output terminal of a power supply device for an environmentally-friendly vehicle, wherein the power supply device includes a high voltage battery, an inverter for converting a direct-current voltage of the high voltage battery into an alternating current voltage to supply the converted voltage to a motor for driving, a 12 V auxiliary battery for supplying a direct current voltage to an electric component of the vehicle when the vehicle starts to drive and supplies a voltage necessary for operating a main relay of the high voltage battery, and a DC-DC converter for converting the direct current voltage received from the high voltage battery to charge the auxiliary battery or to supply the converted voltage to a 12 V electric load,
the method comprising steps of:
estimating, by the power supply device, the impedance of the output terminal of the DC-DC converter; and
determining, by the power supply device, when the estimated impedance exceeds a reference value, that the fault is generated according to an increase in the impedance of the output terminal of the DC-DC converter,
wherein the step of estimating the impedance of the output terminal of the DC-DC converter includes steps of:
measuring, by the power supply device, a voltage difference between an output voltage of the DC-DC converter and an input voltage of an electric load; and
comparing, by the power supply device, the measured voltage difference with a charge/discharge current to calculate the impedance.

\* \* \* \* \*